US008744025B2

(12) United States Patent
Lowdermilk et al.

(10) Patent No.: US 8,744,025 B2
(45) Date of Patent: Jun. 3, 2014

(54) DIGITAL SIGNAL CONDITIONING

(75) Inventors: Robert W. Lowdermilk, San Diego, CA (US); Dragan Vuletic, San Diego, CA (US); Fredric J. Harris, Lemon Grove, CA (US); Michael Tammen, San Diego, CA (US)

(73) Assignee: BAE Systems Information Solutions Inc., McLean, VA (US)

( * ) Notice: Subject to any disclaimer, the term of this patent is extended or adjusted under 35 U.S.C. 154(b) by 247 days.

(21) Appl. No.: 13/126,876

(22) PCT Filed: Aug. 30, 2010

(86) PCT No.: PCT/US2010/047074
§ 371 (c)(1),
(2), (4) Date: Apr. 29, 2011

(87) PCT Pub. No.: WO2011/026004
PCT Pub. Date: Mar. 3, 2011

(65) Prior Publication Data
US 2011/0206163 A1    Aug. 25, 2011

Related U.S. Application Data

(60) Provisional application No. 61/238,235, filed on Aug. 31, 2009.

(51) Int. Cl.
*H04B 1/10* (2006.01)
(52) U.S. Cl.
USPC ........... 375/349; 375/267; 375/346; 375/351; 702/75; 702/76; 324/76.19; 324/76.21; 324/76.22; 324/76.24; 324/76.29

(58) Field of Classification Search
CPC .... G01R 23/165; G01R 23/16; G06F 17/141; G06F 17/142
USPC ............ 702/75, 76, 77, 74; 342/76.19, 76.21, 342/76.22, 76.24; 375/267, 346, 349, 351
See application file for complete search history.

(56) References Cited

U.S. PATENT DOCUMENTS

| | | | | |
|---|---|---|---|---|
| 5,640,424 | A | * | 6/1997 | Banavong et al. ............ 375/316 |
| 6,279,019 | B1 | * | 8/2001 | Oh et al. ........................ 708/300 |
| 6,484,111 | B1 | * | 11/2002 | Nara ............................... 702/77 |
| 6,791,995 | B1 | * | 9/2004 | Azenkot et al. ............... 370/436 |
| 6,870,492 | B1 | * | 3/2005 | Jensen ........................... 341/61 |

(Continued)

OTHER PUBLICATIONS

Harris, Fred "Multirate Signal Processing for Communication Systems", Prentice-Hall, 2004.*

(Continued)

*Primary Examiner* — Sophia Vlahos
(74) *Attorney, Agent, or Firm* — Sand & Sebolt; Daniel J. Long

(57) ABSTRACT

Methods, systems and other embodiments associated with pre-processing a signal for spectral analysis are presented. A system for pre-processing a digital input signal includes a digital down converter (DDC), an interpolator, and a series of down samplers. The DDC modulates the digital input signal to create a down converted signal. The interpolator re-samples the down converted signal to produce a re-sampled signal. The series of down samplers produces down sampled signals. The multiplexer selects one of the digital input signal, the down converted signal, and the down sampled signals and routes the selected signal to an output line.

20 Claims, 8 Drawing Sheets

(56) References Cited

U.S. PATENT DOCUMENTS

| | | | |
|---|---|---|---|
| 6,993,099 B2* | 1/2006 | Zogakis et al. | 375/340 |
| 7,315,571 B1* | 1/2008 | Heidari et al. | 375/222 |
| 2002/0122518 A1* | 9/2002 | Yasuda et al. | 375/372 |
| 2003/0039319 A1* | 2/2003 | Engelse et al. | 375/316 |
| 2004/0017306 A1* | 1/2004 | Miao | 341/155 |
| 2004/0252044 A1 | 12/2004 | Mathis et al. | |
| 2007/0008196 A1* | 1/2007 | Jensen | 341/61 |
| 2007/0184813 A1 | 8/2007 | Pascht et al. | |

OTHER PUBLICATIONS

Lowdermilk et al "Cost Effective, Versatile, High Performance Spectral Analysis in a Synthetic Instrument", IEEE Autotestcon 2008, Salt Lake City, UT, Sep. 8-11, 2008, [retrieved on Oct. 12, 2010]. Retrieved from the Internet :URL http://ieeexplore.ieee.org/Xplore/login.jsp?url=http%3A%2F%2Fieeexplore.ieee.org%2Fiel5%2F4653640%2F4662554%2F04662602.pdf%3Farnumber%3D466262&authDecision=203, entire document.

Lowdermilk et al "Finite Arithmetic Considerations for the FFT Implemented in FPGA-Based Embedded Processors in Synthetic Instruments", IEEE Instrumentation & Measurement Magazine, Aug. 2007, [retrieved on Oct. 12, 2010]. Retrieved from the Internet :URL http://ieeexplore.ieee.org/Xplore/login.jsp?url=http%3A%2F%2Fieeexplore.ieee.org%2Fiel5%2F4653640%2F4662554%2F04662602.pdf%3Farnumber%3D466262&authDecision=203, entire document.

Harris, Fred, "Multirate Signal Processing for Communication Systems," Prentice-Hall, 2004.

Proakis, J. and Manolakis, D. "Digital Signal Processing: Principles, Algorithms, and Applications," 4th Ed., Ch. 8, Prentice-Hall, 2007.

Mitra, S. "Digital Signal Processing: A Computer Approach," 3rd Ed., Ch. 2, McGraw-Hill, 2006.

\* cited by examiner

DIGITAL SIGNAL CONDITIONING

CROSS REFERENCE TO RELATED APPLICATIONS

This application claims priority from PCT Patent Application No. PCT/US2010/047074, filed Aug. 30, 2010 which claims priority from U.S. Provisional Patent Application Ser. No. 61/238,235, filed Aug. 31, 2009; the disclosures of which are incorporated herein by reference.

BACKGROUND OF THE INVENTION

1. Technical Field

The present invention relates generally to apparatus and systems for signal processing. More particularly, the apparatus and systems related to digital signal processing. Specifically, the apparatus and systems of the present invention relate to digital conditioning of a signal with a pre-processing engine.

2. Background Information

Spectrum analysis of an input signal is one of the most common processing tasks of a Synthetic Instrument (SI). Instruments that perform spectrum analysis have evolved over the years from parallel filter bank implantations through sequential swept frequency implementations to modern windowed fast Fourier Transform implementations. Frequency range, desired bandwidths, dynamic range, and the other considerations dictate which of the three techniques or combination of techniques are best suited to a particular application. The previous generations of aviation support equipment dating back over the past forty years (i.e. VAST, CASS) have taught us that continuous change in avionics and test technology is inevitable. "Technology gallop" as well as the changing mission landscape in terms of UUTs to be supported in the future is ever changing-especially if one needs to keep in play a support system such as eCASS for the next 20-30 years. This dynamic situation often results in a mismatch between the operational units to be supported in the field and the test support systems required to RFI and diagnose these systems.

However, that the precision, accuracy, measurement time and computational complexity of measurement systems implemented using Synthetic Instrument technology may be degraded compared to the performance of classic test equipment. Therefore, improved Synthetic Instrument technology is desired.

SUMMARY

The preferred embodiment of preprocessing a digital input for digital signal processing comprises a system. The system includes a digital down converter (DDC), an interpolator, and a series of down samplers. The DDC modulates the digital input signal to create a down converted signal. The digital input signal is a real input signal that corresponds to an intermediate frequency (IF) signal. The interpolator re-samples the down converted signal to produce a re-sampled signal. The series of down samplers produces down sampled signals. The multiplexer selects one of the digital input signal, the down converted signal, and one of the down sampled signals and routes the selected signal to an output line. The output line can be connected to a spectrum analyzer input buffer.

In one configuration of the preferred embodiment, the DDC is a 4-to-1 digital down converter and the down samplers are 2-to-1 down samplers. The interpolator is an M-path polyphase filter bank. The M-Path polyphase filter bank can perform the interpolation based on a Taylor series correction of the down the down converted signal.

In another configuration of the preferred embodiment, the interpolator further includes finite impulse response (FIR) filters and accumulators. The interpolator operates on the down converted signal with the FIR filters to produce the re-sampled signal. The filtering may be based on a modulo (MOD) 32 function.

In one embodiment a method conditions a signal for a spectrum analyzer. The method down converts an input signal to produce a down converted signal. The down converted signal is interpolated to produce an interpolated signal. Next, the interpolated signal is passed through a series of two or more down samplers to produce down sampled singles. The input signal, the converted signal, the interpolated signal and the down sampled signal are multiplexed to an output port as an output signal.

BRIEF DESCRIPTION OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIG. 6 illustrates the preferred embodiment of an example schematic block diagram of Taylor series corrected arbitrary M-path interpolator in.

Similar numbers refer to similar parts throughout the drawings.

DETAILED DESCRIPTION OF THE INVENTION

Figure 1:
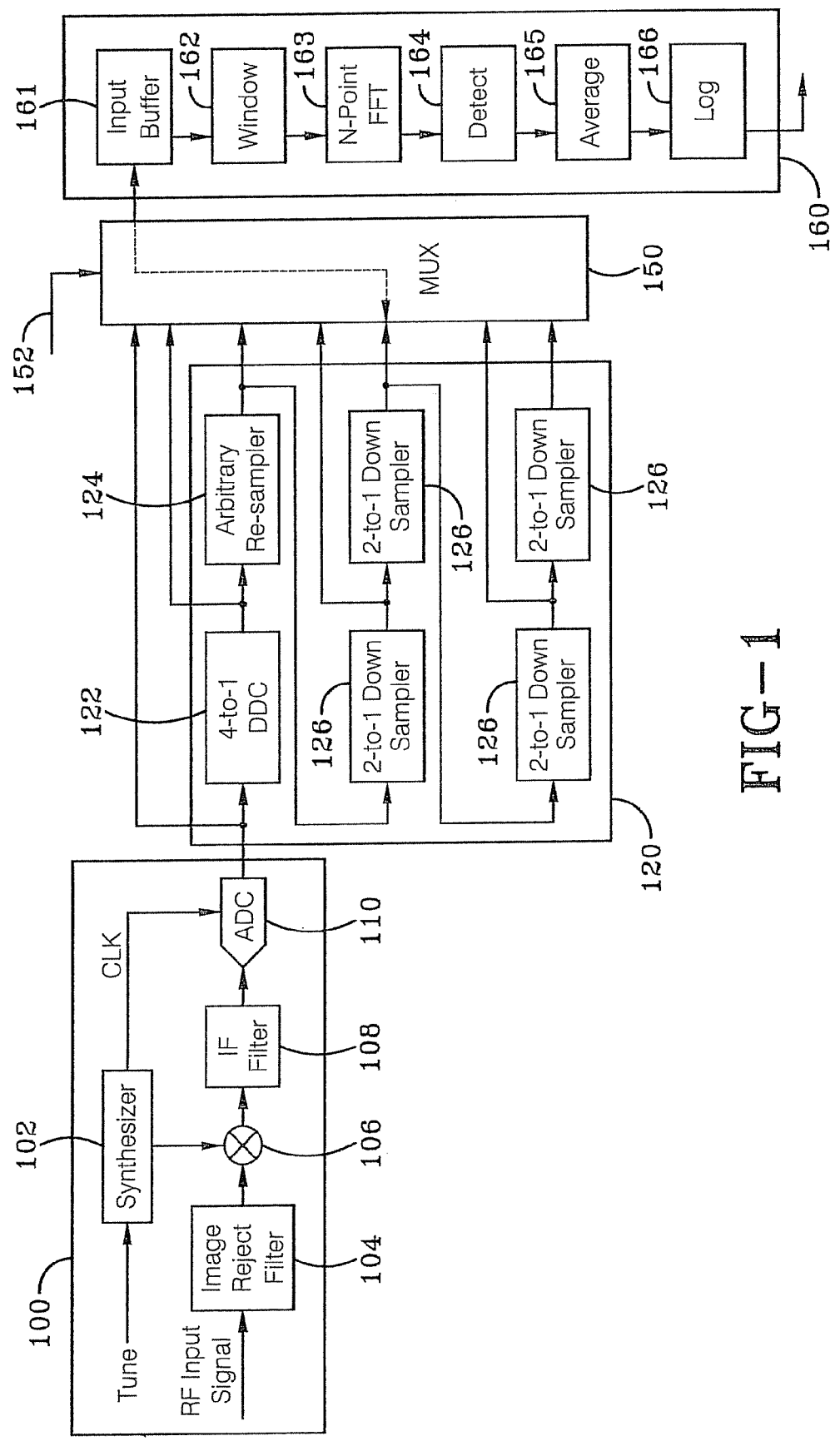
FIG. 1 illustrates an example schematic of an analog conditioning logic, digital signal conditioning logic and spectrum analyzer logic.

FIG. 1 illustrates a digital signal processing (DSP) based signal conditioning logic 120 that produces an arbitrary sample rate and arbitrary spectral span of an output from an ADC 110 of an radio frequency (RF) conditioning logic 100. The digitally conditioned signal is provided to the input buffer 161 of a synthetic instrument spectrum analyzer module 160. Those of ordinary skill in the art will appreciate that the RF conditioning logic can include a synthesizer 102, an image reject filter 104, a mixer 106, an intermediate frequency (IF) filter 108 and an analog to digital converter 110, as well as other components. The synthetic instrument spectrum analyzer module 160 can also include window logic 162, N-Point fast fourier transform (FFT) logic 163, detect logic 164, averaging logic 165, logarithmic logic 166, as well as other components.

In the preferred embodiment, the digital signal conditioning logic 120 includes a digital signal conditioner (DDC) 122, an interpolator 124 (e.g., re-sampler), and two or more down samplers 126. The DDC 122 modulates the digital input signal received from the ADC 110 to create a down converted signal. The interpolator 124 re-samples the down converted signal to produce a re-sampled signal. The series of down samplers 126 produces down sampled signals. A multiplexer (MUX) 152 selects one of the digital input signal, the down converted signal, and one of the down sampled signals and routes the selected signal to a spectrum analyzer input buffer 161. In one configuration of the preferred embodiment, the MUX 152 can be a component external to the digital conditioning logic 120.

The preferred embodiment will now be explained in further detail. The bandwidth of the equivalent filters of an FFT based spectrum analyzer is determined and controlled by the length and shape of the window function applied to the data being analyzed. The center frequency spacing and locations of these equivalent filters are defined by the ratio of input sample rate to FFT length as indicated in Lowdermilk, Wade, and Harris, Fred, "Finite Arithmetic Considerations for the FFT Implemented in FPGA-Based Embedded Processors in Synthetic Instruments", IEEE Instrumentation and Measurement Magazine, August 2007, pp. 44-49, the contents of which are incorporated herein by reference.

$$f(k) = k \frac{f_s}{N} \quad (1)$$

Those of ordinary skill in the art will also appreciate the following references, the contents of which are incorporated herein by reference, may also be helpful in understanding the practice of the preferred embodiment: Harris, Fred "Multirate Signal Processing for Communication Systems", Prentice-Hall, 2004; Proakis, J. and Manolakis, D., "Digital Signal processing: Principles, Algorithms, and Applications", 4-th Ed., Ch. 8, Prentice-Hall, 2007; and Mitra, S., "Digital Signal Processing: A Computer Approach", 3-rd Ed., Ch. 2, McGraw-Hill, 2006.

In theory, combinations of sample rate and trans-form size can be used to obtain any spectral spacing in a spectrum analyzer. In practice, while FFTs are available in different lengths, system engineers often select transform lengths which are powers of 2, such as 1024, 2048, 4096. This restricts N in (1) and passes the burden of obtaining a specified spectral spacing to the sample rate selection. Sample rate selection is intimately tied to the ana-log anti-alias filter and practical considerations limit the number of analog filters available for anti alias filtering. Additionally, it is desirable to avoid a need for the data collection system to have a clock synthesizer able to increment output frequency in arbitrarily small steps. This is where compromises normally may be made.

These conflicting requirements are avoided by collecting data samples at a single fixed sample rate using a small number of analog pre-filters. Next, DSP techniques are applied to control and select bandwidth and sample rate of the signal delivered to the standard spectrum analyzer modules of the synthetic instrument 160. In one attractive option, the sampling is performed from an offset IF frequency to avoid the cost and system compromises associated with an analog quadrature down conversion to baseband. Once in the sampled data domain the signal is converted from real input samples to quadrature baseband output samples as the spectrum is down converted to baseband using very simple, gain and phase matched DSP processing blocks. Since the baseband conversion occurs in conjunction with a bandwidth reduction, an appropriate 4-to-1 sample rate reduction is performed by the DDC 122 to reduce the cost of subsequent processing. At this point an arbitrary sample rate change is also performed by the DSP interpolator 124. For instance, suppose that a 200 MHz sample rate is available after the initial 4-to-1 down sampling operation and a sample rate of 204.8 MHz is needed. In this case, the sample rate change occurs in the arbitrary re-sampler 124 and signal processing artifacts due to the resampling are controlled to be below the quantizing noise levels of the data collection and processing system.

Further reductions in bandwidth and sample rate are available from a cascade of very efficient half band filters which reduce bandwidth and sample rates in a sequence of 2-to-1 down sampling filters 126. Since each stage operates at half the rate of the previous stage the entire cascade, of any number of stages, following the first half band filter has a computational work load less than that of the first stage. The multiplexer 150 selects through a select line 152 the signal at the desired down sample rate and bandwidth of the cascade chain to be presented to the spectrum analyzer section 160. Note that this architecture offers the option of having spectrum available at multiple resolutions.

The capabilities of this system examining the processing of an example signal. Suppose a fixed sample rate of 800 MHz is available and a 25-MHz span of frequencies is to be examined with a spectral spacing of 1 kHz. To control scalloping loss, the equivalent analysis filters will overlap at their 0.1 dB points and have 80 dB stop band attenuation. In order to resolve the 30 MHz frequency span into 1 kHz intervals, 25,000 frequency bins would be obtained. To satisfy the Nyquist criterion, the sample rate of the signal delivered to the FFT must exceed 25 MHz.

Figure 2:
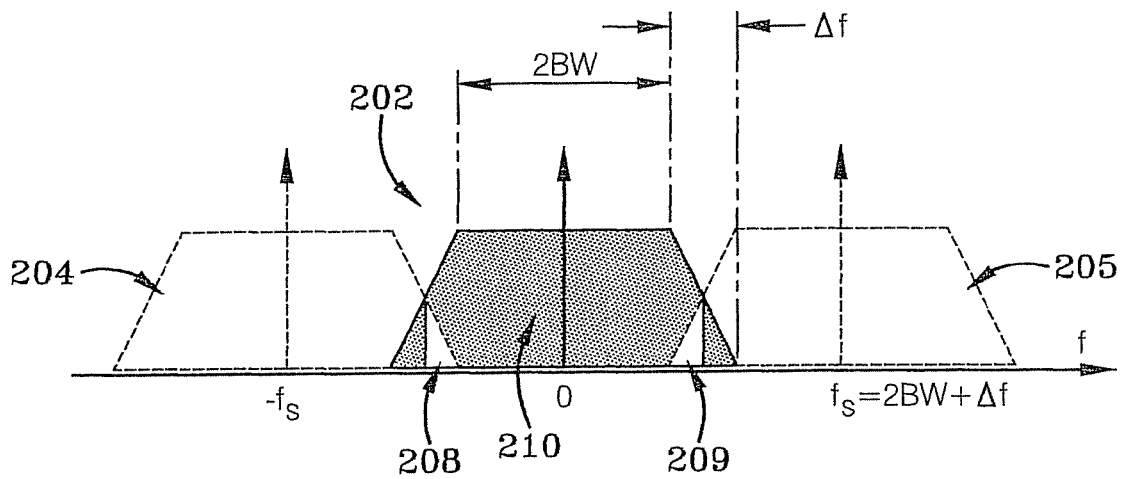
FIG. 2 illustrates a graph of permissible overlap of adjacent spectral replicates due to sampling in a preferred embodiment of the present invention.

For practical considerations, the sample rate of a spectrum analyzer 160 should exceed the sum of the signal's two sided bandwidth and the transition bandwidth of the analog anti-aliasing filter by which the input signal was band limited prior to being sampled. Operation at this selected sample rate permits spectral folding of the transition bandwidth as shown in FIG. 2. The folded spectra are confined to the transition bandwidth and do not intrude into the signal 2-sided bandwidth. This Figure also illustrates the folding frequency 202, spectral replicates 205/206, transition bands 208/209 and the alias free band 210.

The transition bandwidth of reasonable order analog filters is upper bounded by 10 percent of the two sided pass band bandwidth. A 10th order elliptic filter would be required to obtain a 10% excess bandwidth. For this filter, its form factor defined as the ratio of 80 dB bandwidth to 0.1-dB bandwidth would be 1.2. So at a minimum, the excess sample rate to accommodate the analog filter transition bandwidth would be equal to or greater than 20% above the 25 MHz signal bandwidth or 30 MHz.

To maintain the 1 kHz spectral spacing for a 30.0 MHz sample rate a 30,000 point discree fourier transform (DFT) is needed. An FFT for 30,000 points can be achieved but as indicated earlier it is desirable to use FFTs with lengths that are powers of 2. The next size radix-2 FFT greater than 30,000 would be 215 or 32,768. The final selection of sample rate occurs now. The FFT length is selected to be 32,768 and with a 1 kHz spectral spacing. Therefore, the sample rate for data presented to the transform to be 32.768 MHz. The defines the sample rate delivered to the right hand side processing blocks of FIG. 1.

As previously mentioned, the signal conditioning consists of a set of bandwidth reducing and sample rate reducing filters 126 as well as an arbitrary resampler 124 between the 4-to-1 down sampler 122 and the cascade 2-to-1 down samplers 126. The task and function of the arbitrary resampler will now be discussed. The frequency is analyzed by beginning at the output one of the cascade 2-to-1 down samplers "M" 126 with an output rate of 32.768 MHz. This rate is doubled till it exceeds the 200 MHz sample rate at the output of the input 4-to-1 down sampler 122. The sequence proceeds as follows:

| Filter M: | Output Rate, | 32.768 MHz |
|---|---|---|
| | Input Rate, | 65.576 MHz |
| Filter M-1: | Output Rate, | 65.576 MHz |
| | Input Rate, | 131.072 MHz |
| Filter M-2: | Output Rate, | 131.072 MHz |
| | Input Rate, | 262.144 MHz |

If the input rate to three successive half band filters 126 is 262.144 MHz, the desired 32.768 MHz output rate is obtained after the three stages of half band processing.

The task of the arbitrary resampler 124 is to start with the 200 MHz sample rate from the output of the 4-to-1 down sampler 122 and resample it to 262.144 MHz, the desired input rate to the cascade of 2-to-1 down samplers 126. The re-sampling operation should be accomplished while preserving the dynamic range of the input signal which was identified as 80 dB. This means that spectral artifact levels due to the interpolation process must be 80 dB below the maximum output level of the input signal. This information guides the specifications of the prototype filter used in the arbitrary interpolator.

Figure 3:
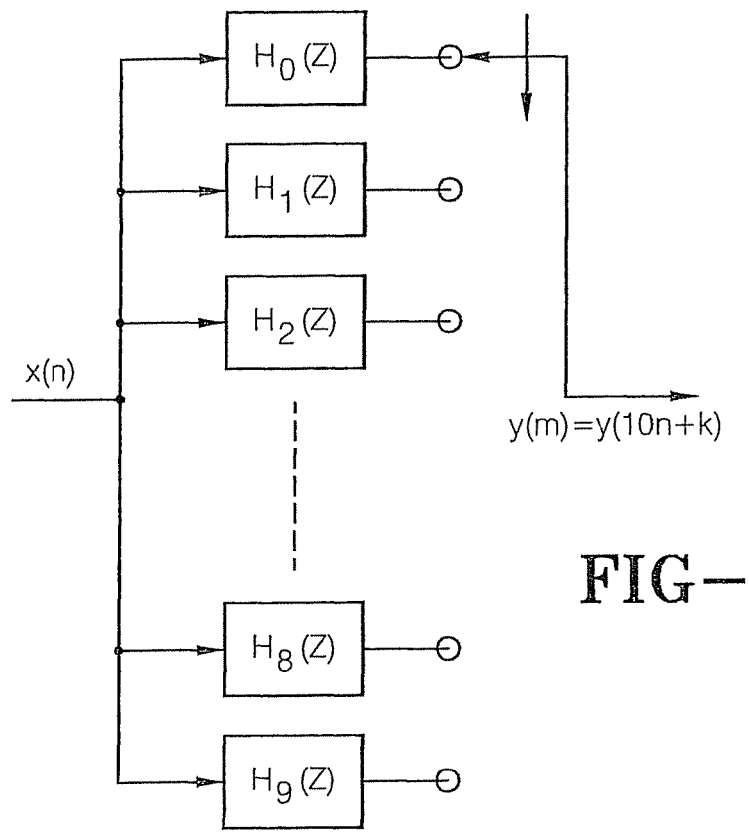
FIG. 3 illustrates a schematic drawing of a 10-path polyphase interpolating filter.
Figure 4:
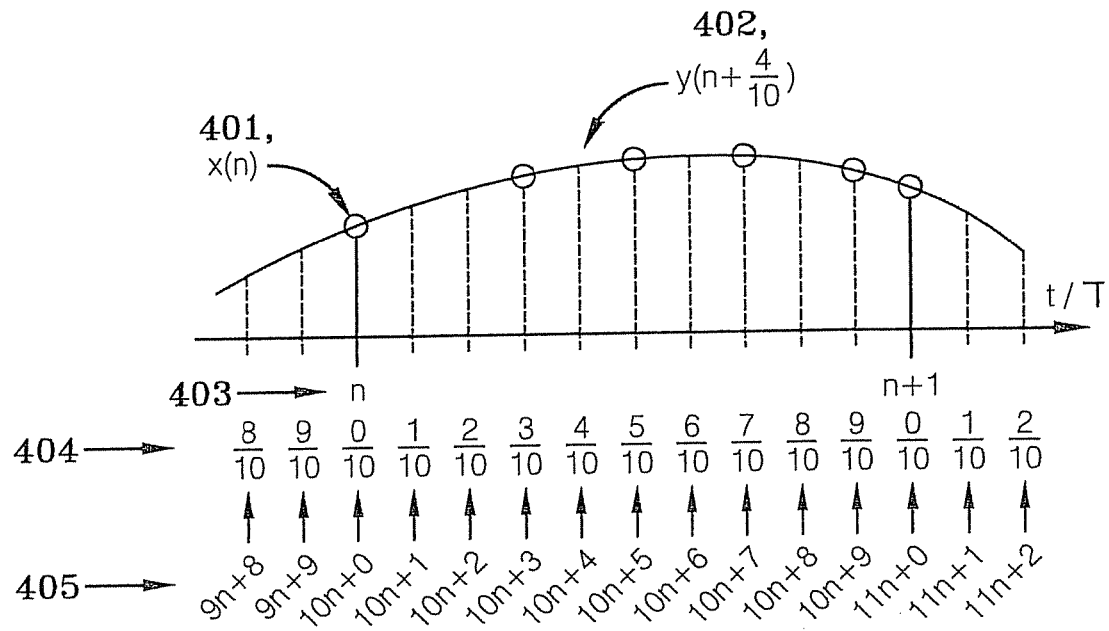
FIG. 4 illustrates an example graph showing input and output sample indices for 1-to-10 Interpolator.

The arbitrary interpolation can performed with an M-path polyphase filter bank 300 that can compute interpolated values of a sample rate M times higher than the input rate. At the higher sample rate the time interval between "nT" and sample "(n+1)T" is divided into M sample positions identified as "nT+k T/M". The structure of the M-path filter 300 is shown in FIG. 3 and the relationship between input and output sample indices is shown in FIG. 4 for the specific case that M=10. FIG. 4 also displays an input sample 401, an output sample 402 as well as input indexes 403, offset increments 404 and output indexes 405.

Figure 5:
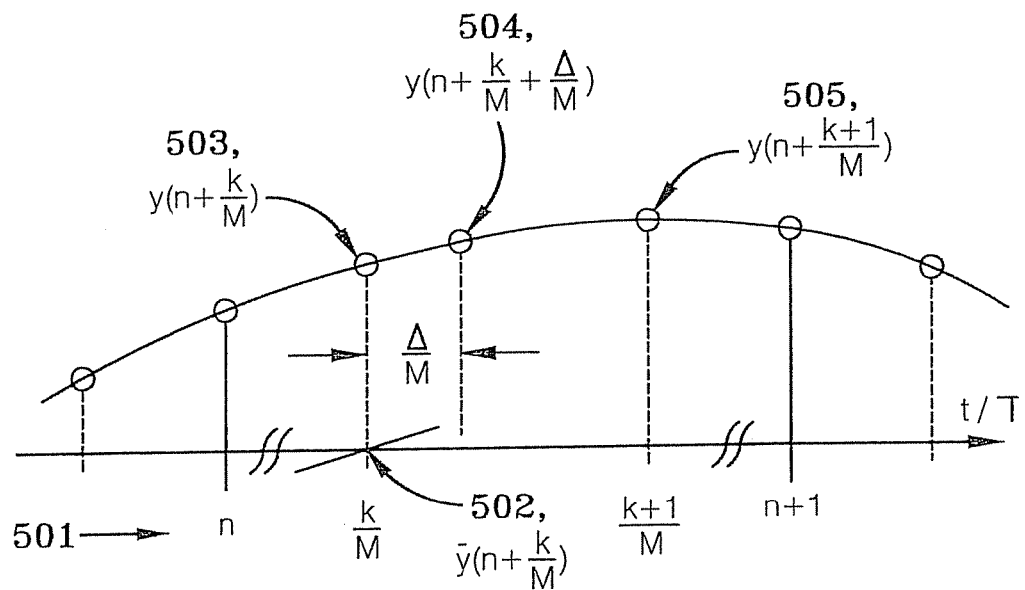
FIG. 5 illustrates an example a graph showing interpolating with a local Taylor series.
Figure 6:
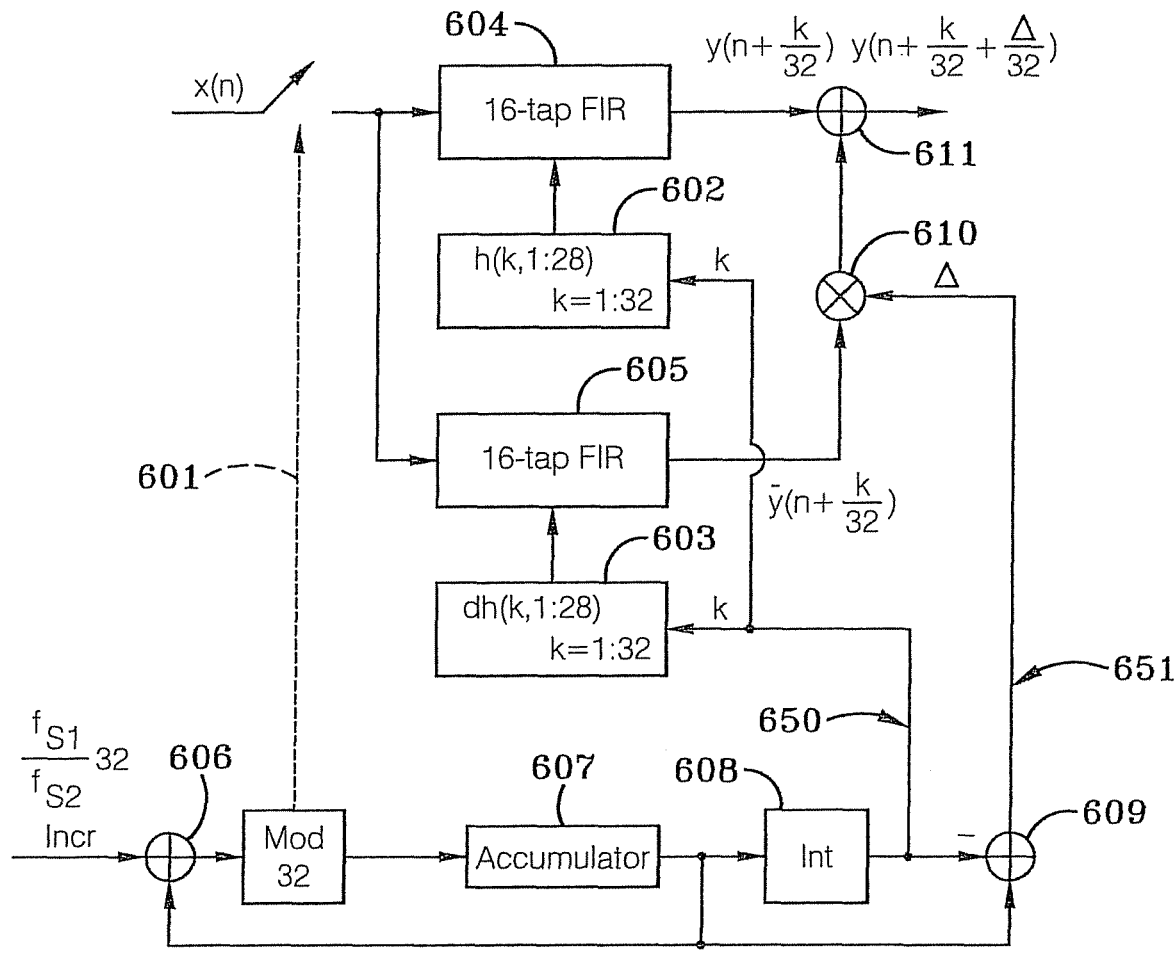

The granularity of the time increment obtained with an M-path filter is 1-part in-M which would require M to be quite large to obtain fine resolution time positions required for arbitrary interpolation. Rather than Increase the number of paths in the M-path filter, a second M-path filter is used which computes the sample derivative corresponding to the interpolated sample. Then the sample value offset is computed from the k-th filter path with a local Taylor series as indicated in equation (2) and in FIG. 5. FIG. 5 also illustrates the input index 501, the slope sample 502, the amplitude sample 503, the Taylor series sample 504 and the amplitude sample 505. The block diagram of the Taylor series corrected M-Path Interpolating filter is shown in FIG. 6. FIG. 6 also illustrates the input of the next input sample on accumulator overflow 601, the block generating interpolator weights 602, the block generating derivative weights 603, 16-tap FIR filters (604, 605), accumulators (606, 608, 609, 610, 611), int block 608, the integer part signal and the fractional part signal 651.

$$y\left(n + \frac{k}{M} + \frac{\Delta}{M}\right) \cong y\left(n + \frac{k}{M}\right) + \frac{\Delta}{M}\dot{y}\left(n + \frac{k}{M}\right) \quad (2)$$

Figure 7:
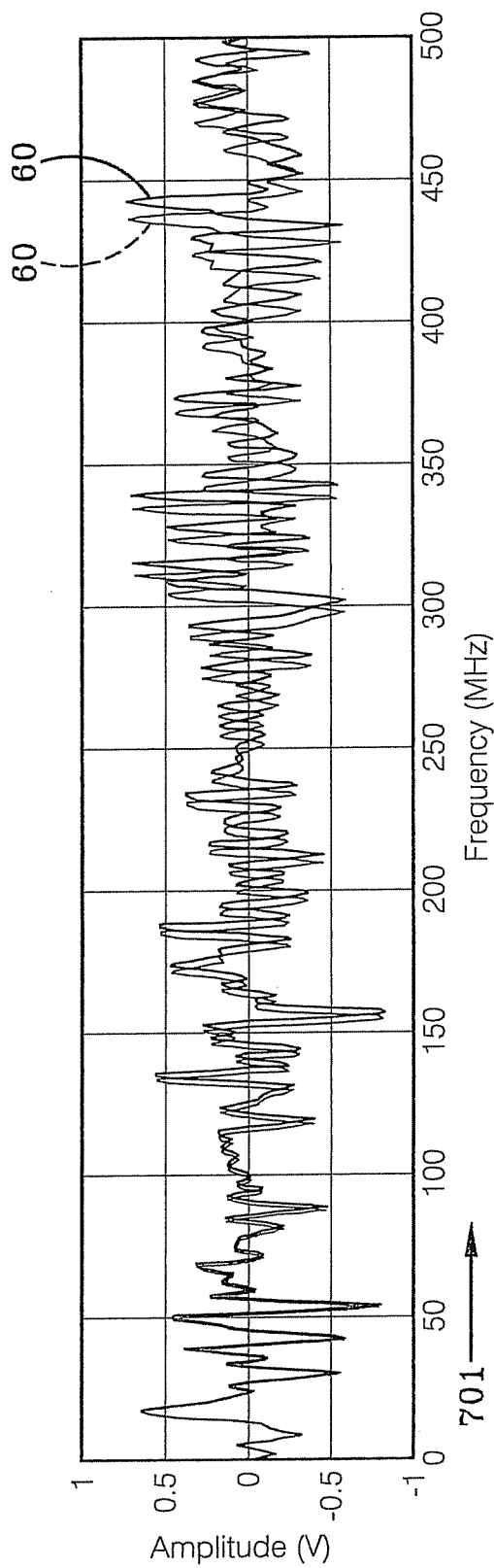
FIG. 7 illustrates the preferred embodiment of an interpolated time series formed by a Taylor series correcting M-path filter.

FIG. 7 presents an example of a time series interpolated by the Taylor series corrected M-path interpolator. This figure shows the input sample 602 and output sample 603. The output sample rate was increased by 2% from 160 MHz to 163.2 MHz. The two time series, input and output, from the interpolator are displayed by their time sample index 601 rather than by the time interval between indices.

Consequently, the interpolated and up-sampled output sequence which requires more samples to span a give interval appears to exhibit successively greater delay relative to the same sample time of the input series.

Discussed below is a summary discussion of the signal processing stream of the spectrum analyzer signal conditioning logic 120 of FIG. 1. Recall this logic performs tasks including:

i) Down conversion and 4-to-1 down sampling of a 20 MHz band centered at 200 MHz and sampled at 800 MHz.
ii) Resampling from 200 MHz to 262.144 MHz with the arbitrary resampler.
iii) Three stages of half band filtering and 2-to-1 resampling.

Figure 8A:
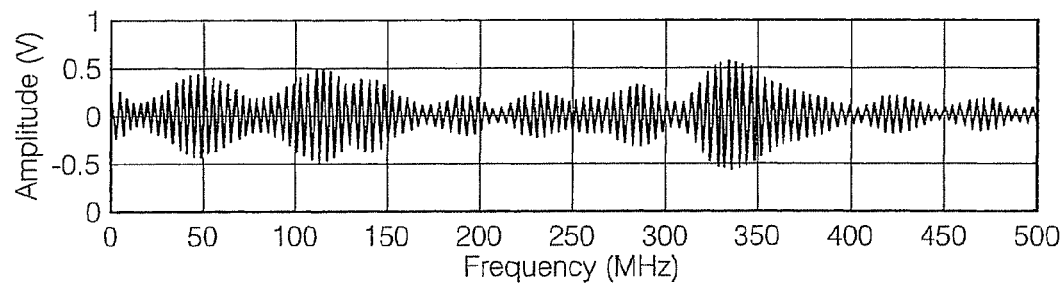
FIGS. 8A-G illustrates a series of example graphs showing the time series and spectra of a signal processed by the preferred embodiment of the digital signal conditioner.
Figure 8B:
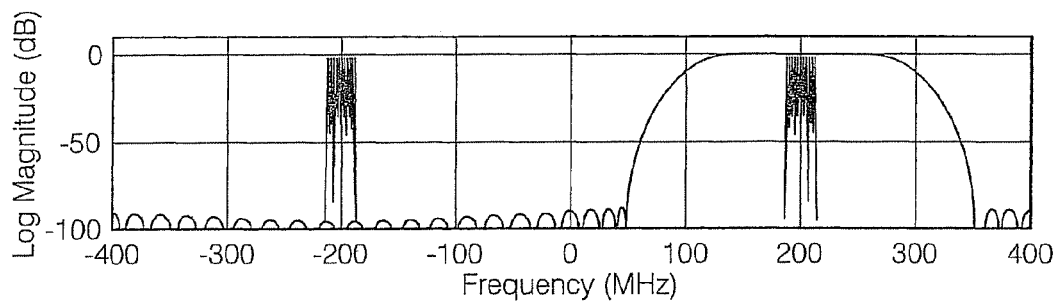
Figure 8C:
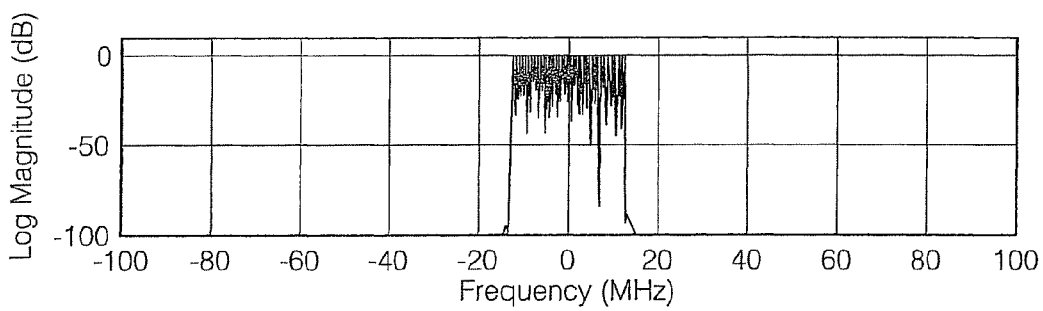
Figure 8D:
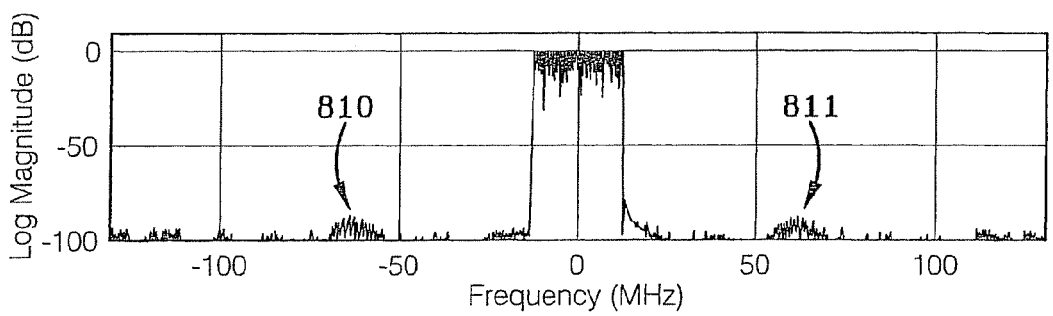
Figure 8E:
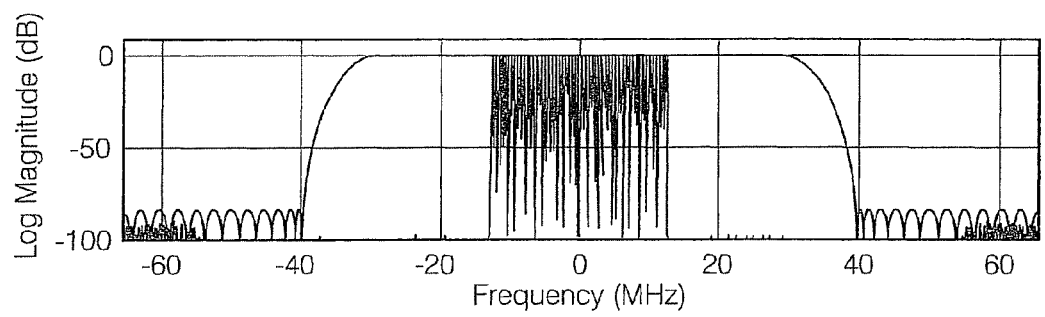
Figure 8F:
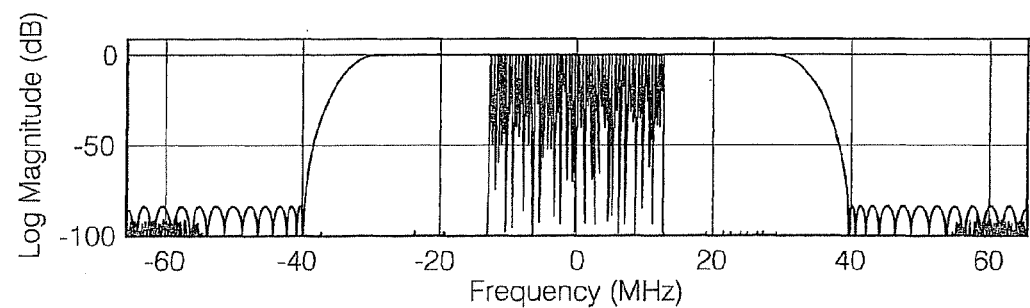
Figure 8G:
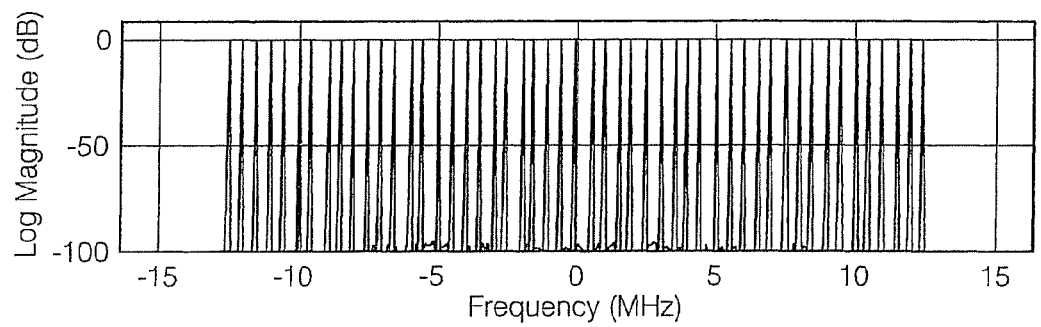

The digital signal condition logic 120 was simulated. The sequence of simulated spectra from successive processing blocks in FIG. 1 is presented in FIGS. 8A-G. Here we see the signal spectral band occupying successively larger fractions of the spectral span as the noise bandwidth and sample rate are reduced. FIG. 8A illustrates the real input time sequence. FIG. 8B illustrates the input spectra, the input 4-to-1 down sampling and the alias to baseband filter. FIG. 8C illustrates the output spectra after the 4-to-1 down sampling filter. FIG. 8E illustrates the output spectra after the interpolator FIG. 8F illustrates the output spectra of the first 2-to-1 down sampling filter. FIG. 8G illustrates the output spectra of the second 2-to-1 down sampling filter. FIG. 8H illustrates the output spectra of the third 2-to-1 down sampling filter.

The signal available at the output of the third half band filter is sampled at 32.768 MHz which when processed by a 32,768 (215) point results in a spectral spacing of 1 kHz. The scalloping loss and dynamic range of the FFT is controlled by the window selected for the spectral analysis. This may be considered an FFT based specification which is beyond the scope of a disclosure of a preferred embodiment.

In summary, versatile block of signal conditioning options has been described that processes raw data samples from the A-to-D converter and delivers a filtered and resampled version of those data samples to a conventional FFT based spectrum analyzer. The conditioning performs a number of important processing functions. These include spectral translation to baseband, noise bandwidth reduction to signal bandwidth, and arbitrary resampling to obtain specified spectral spacing with available sized FFTs. The versatility of an field programmable gate array (FPGA) based processor and signal conditioning block enables the use of the signal conditioner blocks to align samples rate with transform sizes without the need to vary input sample clock rate or the cut off bandwidth of analog anti-alias filters in the signal path.

A straw man set of specifications for the spectrum analyzer was proposed and used as the basis of the simulations presented. The processing described here reflects the great versatility and flexibility available to the system de-signer. Broader bandwidths and greater dynamic range options can be quickly accommodated in the architecture of the preferred embodiment.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 9:
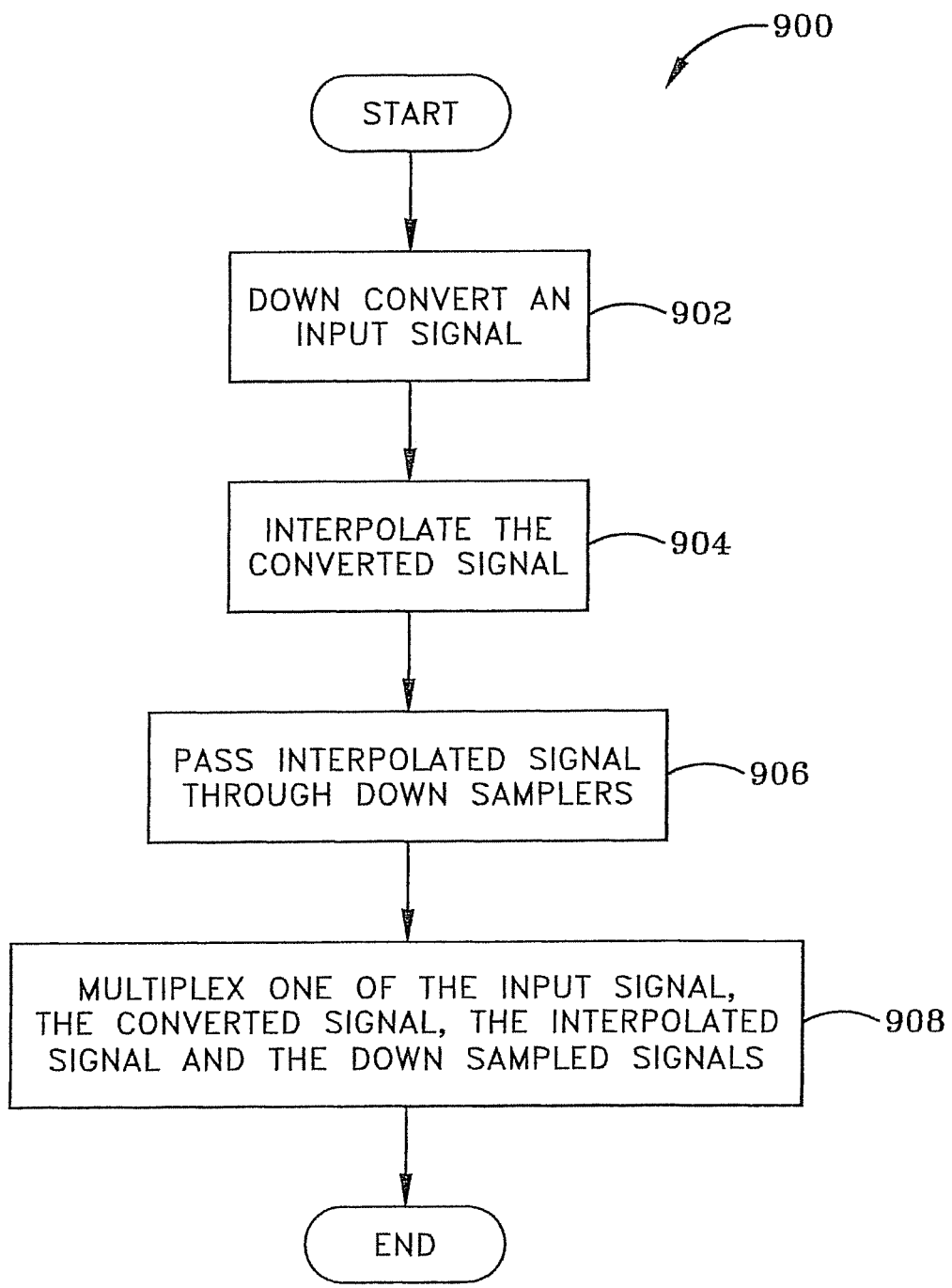
FIG. 9 illustrates configuration of the preferred embodiment as a method of digital signal conditioning.

FIG. 9 illustrates a configuration of the preferred embodiment as a method 900 of digital signal conditioning. The method 900 down converts an input signal, at 902, to produce a down converted signal. The signal may be down converted with a digital 4-to-1 down converter. The down converted signal is interpolated, at 904, to produce an interpolated signal. The interpolation may be performed as previously discussed. The interpolated signal is passed through a series of two or more down samplers, at 906, to produce down sampled singles. The method 900 multiplexes, at 908, one of the input signal, the converted signal, the interpolated signal and the down sampled signals to an output port as an output signal. This port can then be connected to a spectrum analyzer.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A system for pre-processing a digital input signal comprising:
    a digital down converter (DDC) configured to down convert and down sample at a DDC sample rate a spectral component of the digital input signal to baseband, while reducing bandwidth and sample rate to create a down converted signal at baseband;
    an interpolator configured to re-sample the down converted signal to produce a re-sampled signal with a new sample rate, wherein a dynamic range of the digital input signal is preserved and the new sample rate is different than the DDC sample rate;
    two or more down samplers configured to produce two or more down sampled signals associated with the down samplers, wherein the two or more down samplers are connected in series, with the re-sampled signal input to a first one of the two or more down samplers, wherein the two or more down sampled signals are output from each of the two or more down samplers connected in series; and
    a multiplexer configured to multiplex one of the group of: the digital input signal, the down converted signal, and one of the two or more down sampled signals to an output line.

2. The system of claim 1 wherein the sample rate of the DDC results in a 4-to-1 sample reduction.

3. The system of claim 1 wherein the two or more down samplers are 2-to-1 down samplers.

4. The system of claim 1 wherein the interpolator is an M-path polyphase filter bank, wherein M is an integer.

5. The system of claim 4 wherein the M-Path polyphase filter bank performs interpolation based, at least in part, on a Taylor series correction of the down converted signal.

6. The system of claim 1 wherein the digital input signal is a real input signal and not a quadrature based signal.

7. The system of claim 1 wherein the output line is configured to be connected to a spectrum analyzer input buffer.

8. The system of claim 1 wherein the interpolator comprises:
    one or more finite impulse response (FIR) filters;
    one or more accumulators; and
    wherein the interpolator is configured to operate on the down converted signal with the one or more FIR filters to produce filter values, wherein the filter values are accumulated in the one or more accumulators to produce accumulated values, and wherein the re-sampled signal is based, at least in part, on the filter values and accumulator values.

9. The system of claim 1 wherein the interpolator is configured to produce the re-sampled signal based, at least in part, on a modulo (MOD) 32 function.

10. The system of claim 1 wherein the interpolator is configured to produce derivative weights of the down converted signal and configured to produce interpolator weights of the down converted signal, and wherein the re-sampled signal is based, at least in part, on the derivative weights and the interpolator weights.

11. The system of claim 1 wherein the interpolator is configured to change the DDC sample rate to a fractional ratio between 0.5 and 2.0 so that 0.5<DDC sample rate/new sample rate<2.0.

12. A method of digital signal conditioning comprising:
    down converting and down sampling a received input signal at a digital down converter (DDC) sample rate to produce a down converted signal;

determining a desired FFT rate corresponding to an FFT length of a FFT logic;

using the desired FFT rate as an output rate of a series of down samplers connected back-to-back and calculating down sampler input values of the series of down samplers until a specific down sampler input value of one of the down samplers is the closest to the DDC sample rate as compared to the other down sampler input values of the series of down samplers, wherein the specific down sampler input value is a value of a desired arbitrary resampler sample rate;

resampling the down converted signal at the desired arbitrary resampler sample rate to produce a resampled signal, wherein a bandwidth of the down converted signal is preserved and the desired arbitrary resampler sample rate is different than the DDC sample rate;

inputting the resampled signal into the series of down samplers;

outputting to the FFT logic the output value of a down sampler of the series of down samplers that produces the desired FFT rate.

13. The method of claim 12 wherein the resampling comprises:
filtering the down converted signal with an M-path polyphase filter bank, wherein M is an integer;
generating the resampled signal based, at least in part, on a result of the filtering.

14. The method of claim 12 wherein the resampling comprises:
passing the down converted signal through a finite impulse response (FIR) filter; and
generating the resampled signal based, at least in part, on an output of the FIR filter.

15. The method of claim 12 further comprising:
receiving the received input signal from an analog-to-digital converter (ADC).

16. The method of claim 15 wherein the receiving further comprises:
receiving the received input signal that is an intermediate frequency (IF) signal.

17. The method of claim 12 further comprising:
transferring the output value of the down sampler that produces the desired FFT rate to an input buffer of a spectrum analyzer.

18. The method of claim 12 wherein the down converting and down sampling comprises:
passing the input signal through a 4-to-1 digital down converter.

19. The method of claim 12 wherein the series of down samplers is a series of 2-to-1 down samplers.

20. A method comprising:
down converting and down sampling an input signal at a DDC sample rate to produce a down converted signal;
determining a desired FFT rate;
sequentially doubling the desired FFT rate creating doubled values until a doubled value exceeds the DDC sample rate;
assigning a created doubled value that is the closest to the DDC sample rate as a desired arbitrary resampler rate;
resampling the down converted signal at the desired arbitrary resampler rate to produce a resampled signal, wherein a bandwidth of the down converted signal is preserved and the DDC sample rate is different than the desired arbitrary resampler rate;
passing the resampled signal through a series of 2-to-1 down samplers to produce a new signal at the desired FFT rate; and
inputting the new signal into a spectrum analyzer.

* * * * *